United States Patent
Yadav et al.

(10) Patent No.: US 9,442,842 B2
(45) Date of Patent: Sep. 13, 2016

(54) MEMORY SYSTEM PERFORMANCE CONFIGURATION

(71) Applicant: SanDisk Technologies Inc., Plano, TX (US)

(72) Inventors: Preeti Yadav, Cupertino, CA (US); Barys Sarana, Fremont, CA (US); Abhijeet Bhalerao, San Jose, CA (US); Frederick Fernandez, San Francisco, CA (US); Namita Joshi, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 160 days.

(21) Appl. No.: 13/970,438

(22) Filed: Aug. 19, 2013

(65) Prior Publication Data

US 2015/0052289 A1 Feb. 19, 2015

(51) Int. Cl.
| | | |
|---|---|---|
| *G06F 12/00* | (2006.01) | |
| *G06F 13/00* | (2006.01) | |
| *G06F 13/28* | (2006.01) | |
| *G06F 12/02* | (2006.01) | |
| *G06F 13/42* | (2006.01) | |
| *G11C 11/56* | (2006.01) | |
| *G11C 16/10* | (2006.01) | |
| *G11C 29/50* | (2006.01) | |

(52) U.S. Cl.
CPC ....... *G06F 12/0246* (2013.01); *G06F 13/4234* (2013.01); *G11C 11/5628* (2013.01); *G11C 16/102* (2013.01); *G11C 29/50012* (2013.01)

(58) Field of Classification Search
CPC .................................................. G06F 12/0246
USPC ......................................................... 711/103
See application file for complete search history.

(56) References Cited

U.S. PATENT DOCUMENTS

| | | | |
|---|---|---|---|
| 5,070,032 A | | 12/1991 | Yuan et al. |
| 5,095,344 A | | 3/1992 | Harari |
| 5,313,421 A | | 5/1994 | Guterman et al. |
| 5,315,541 A | | 5/1994 | Harari et al. |
| 5,343,063 A | | 8/1994 | Yuan et al. |
| 5,436,913 A | * | 7/1995 | Yamamura et al. .......... 714/719 |
| 5,467,309 A | * | 11/1995 | Tanaka et al. ........... 365/185.14 |
| 5,570,315 A | | 10/1996 | Tanaka et al. |
| 5,661,053 A | | 8/1997 | Yuan |

(Continued)

FOREIGN PATENT DOCUMENTS

WO    WO 2009/086417    7/2009

OTHER PUBLICATIONS

Notification of Transmittal of the International Search Report and the Written Opinion of the International Searching Authority, or the Declaration, International Application No. PCT/US2014/048476 mailed Feb. 10, 2015, 12 pages.

(Continued)

*Primary Examiner* — Sheng-Jen Tsai
(74) *Attorney, Agent, or Firm* — Davis Wright Tremaine LLP

(57) ABSTRACT

A nonvolatile memory die is tested to determine certain parameters such as read time, which are then recorded in the nonvolatile memory die. After the die is incorporated into a memory system, and firmware is downloaded, the nonvolatile memory system uses the recorded parameters to determine how to configure the memory system for operation within specified limits, such as determining how much delay to apply to read operations.

18 Claims, 9 Drawing Sheets

(56) References Cited

U.S. PATENT DOCUMENTS

| | | | |
|---|---|---|---|
| 5,903,495 A | 5/1999 | Takeuchi et al. | |
| 6,046,935 A | 4/2000 | Takeuchi et al. | |
| 6,219,384 B1* | 4/2001 | Kliza | G06F 1/10 327/158 |
| 6,222,762 B1 | 4/2001 | Guterman et al. | |
| 6,278,633 B1* | 8/2001 | Wong et al. | 365/185.03 |
| 6,459,621 B1 | 10/2002 | Kawahara et al. | |
| 7,301,831 B2* | 11/2007 | Ware | G06F 13/1689 365/191 |
| 8,484,407 B2* | 7/2013 | Haukness et al. | 711/103 |
| 2002/0018371 A1* | 2/2002 | Nasu | G11C 16/102 365/189.011 |
| 2004/0160256 A1* | 8/2004 | Kuroda | H03H 11/265 327/277 |
| 2005/0041485 A1* | 2/2005 | Nobunaga | G11C 7/1072 365/194 |
| 2006/0133149 A1* | 6/2006 | Chae | G11C 5/145 365/185.18 |
| 2009/0052255 A1* | 2/2009 | Moon | G11C 16/10 365/185.19 |
| 2009/0254730 A1* | 10/2009 | Dunshea et al. | 711/170 |
| 2009/0307707 A1* | 12/2009 | Gellerich | G06F 9/526 718/107 |
| 2009/0320028 A1* | 12/2009 | Gellerich | G06F 9/526 718/102 |
| 2011/0128787 A1* | 6/2011 | Shelton et al. | 365/185.08 |
| 2011/0191526 A1* | 8/2011 | Haukness et al. | 711/103 |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

Technical Search Report, Jun. 18, 2013, 6 pages.

* cited by examiner

Programming into four states represented by a 2-bit code

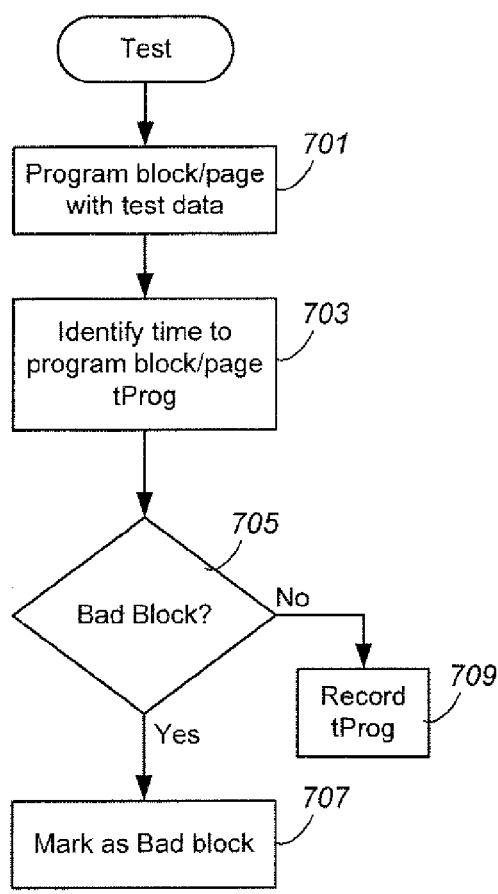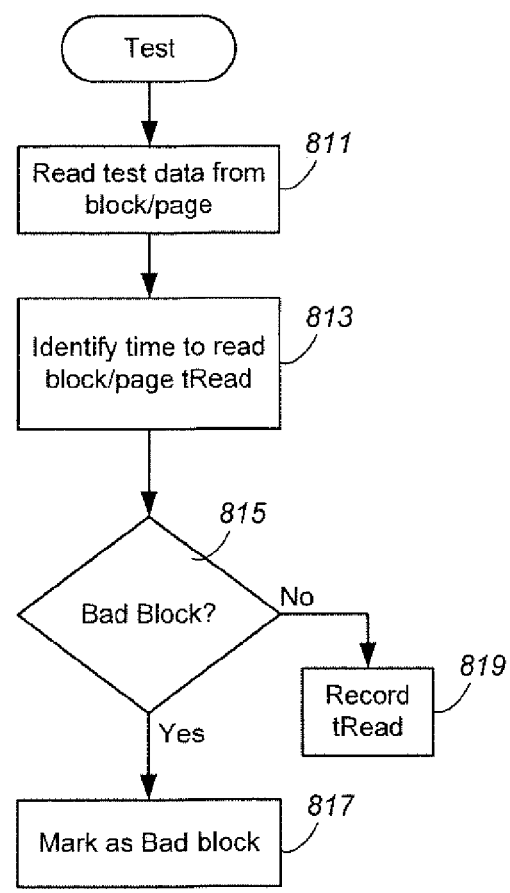
FIG. 7
FIG. 8

MEMORY SYSTEM PERFORMANCE CONFIGURATION

BACKGROUND

This application relates to the operation of re-programmable nonvolatile memory systems such as semiconductor flash memory systems, and, more specifically, to systems and methods of configuring such systems.

Solid-state memory capable of nonvolatile storage of charge, particularly in the form of EEPROM and flash EEPROM packaged as a small form factor card, has become the storage of choice in a variety of mobile and handheld devices, notably information appliances and consumer electronics products. Conventional mass storage, based on rotating magnetic medium such as hard drives and floppy disks, is unsuitable for the mobile and handheld environment. On the other hand, flash memory, both embedded and in the form of a removable card is ideally suited in the mobile and handheld environment because of its small size, low power consumption, high speed and high reliability features.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. In particular, flash memory such as Flash EEPROM allows entire blocks of memory cells to be erased at the same time.

Nonvolatile memory devices are also manufactured from memory cells with a dielectric layer for storing charge. In addition to charge storage memory, other forms of nonvolatile memory may be used in nonvolatile memory systems. For example Ferroelectric RAM (FeRAM, or FRAM) uses a ferroelectric layer to record data bits by applying an electric field that orients the atoms in a particular area with an orientation that indicates whether a "1" or a "0" is stored. Magnetoresistive RAM (MRAM) uses magnetic storage elements to store data bits. Phase-Change memory (PCME, or PRAM) such as Ovonic Unified Memory (OUM) uses phase changes in certain materials to record data bits. Various other nonvolatile memories are also in use or proposed for use in nonvolatile memory systems.

Nonvolatile memory systems, such as flash memory systems are commonly provided in the form of a memory card or flash drive that is removably connected with a variety of hosts such as a personal computer, a camera or the like, but may also be embedded within such host systems. A common memory system comprises one or more memory chips that are mounted on a printed circuit board, along with a memory controller chip, and enclosed in a housing to form a memory card or Universal Serial Bus (USB) flash drive that has a physical interface that allows it to be connected with a range of host devices.

SUMMARY

According to a general aspect of the invention, certain test results obtained from testing an integrated circuit are recorded so that they can be used to configure a system containing the integrated circuit according to the characteristics of individual integrated circuits it comprises. In this way, systems containing integrated circuits having different characteristics may be configured to have similar characteristics. For example, nonvolatile memory systems containing memory dies that operate at different speeds (different write, read, and erase times) may be configured according to characteristics of the individual dies so that the nonvolatile memory systems operate at or near a target speed. In some cases, characteristics of memory dies are obtained as part of bad block detection and may be stored in the nonvolatile memory die without adding significant testing time.

An example of a method of configuring a nonvolatile memory system includes: obtaining a raw programming time for a programming operation in at least a portion of a nonvolatile memory array; obtaining an operating overhead time for the programming operation in at least the portion of the nonvolatile memory array; calculating, in the nonvolatile memory system, a delay such that the raw programming time plus the operating overhead time plus the delay is equal to a target time for the programming operation; and applying the delay to subsequent programming operations in at least the portion of the nonvolatile memory array.

The raw programming time may be derived from test results that are recorded in the nonvolatile memory and obtained from the memory array by performing a read of the memory array. The raw programming time may be an average of a plurality of programming times obtained during testing. The target time may be within a required range for the nonvolatile memory system. The delay may be such that it reduces effective memory programming time from longer than the required range to within the required range. The delay may be obtained for a nonvolatile memory die, and additional delays may be obtained for additional memory dies, each additional delay being individually calculated from a raw programming time of a corresponding additional memory die. The overhead time may be the same for all portions of the nonvolatile memory die and the additional memory dies. The overhead time may be determined for a particular firmware version operating with a particular nonvolatile memory design, the overhead time being downloaded when the particular firmware version is downloaded to a nonvolatile memory having the particular nonvolatile memory design. The target time may be downloaded to the nonvolatile memory system with firmware.

An example of a nonvolatile memory system includes: a nonvolatile memory array; and a memory controller connected to the nonvolatile memory array, the memory controller configured to calculate a program delay time, $t_{delay}$, for program operations in the nonvolatile memory array from a target programming time, $t_{target}$, a raw programming time, $t_{raw}$, and an overhead time $t_{oh}$, according to the formula: $t_{delay}=t_{target}-(t_{raw}+t_{oh})$ and to apply the program delay to subsequent programming operations to obtain an effective programming time that is equal to $t_{target}$.

The memory controller may be further configured to calculate $t_{raw}$ from an average of a plurality of measured programming times. The memory controller may be further configured to write $t_{delay}$ to the nonvolatile memory array for subsequent use. The memory controller may be configured to operate according to firmware and wherein $t_{oh}$ and $t_{target}$ are downloaded with the firmware. The memory controller may be configured to calculate $t_{delay}$ at a time following downloading of the firmware. The value of $t_{raw}$ may be obtained from testing of programming time in the nonvolatile memory array. The nonvolatile memory array may be a NAND flash memory array.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIG. 7 illustrates an example of testing of program time of a nonvolatile memory.

FIG. 8 illustrates an example of testing of read time of a nonvolatile memory.

DETAILED DESCRIPTION

Memory System

Figure 1:
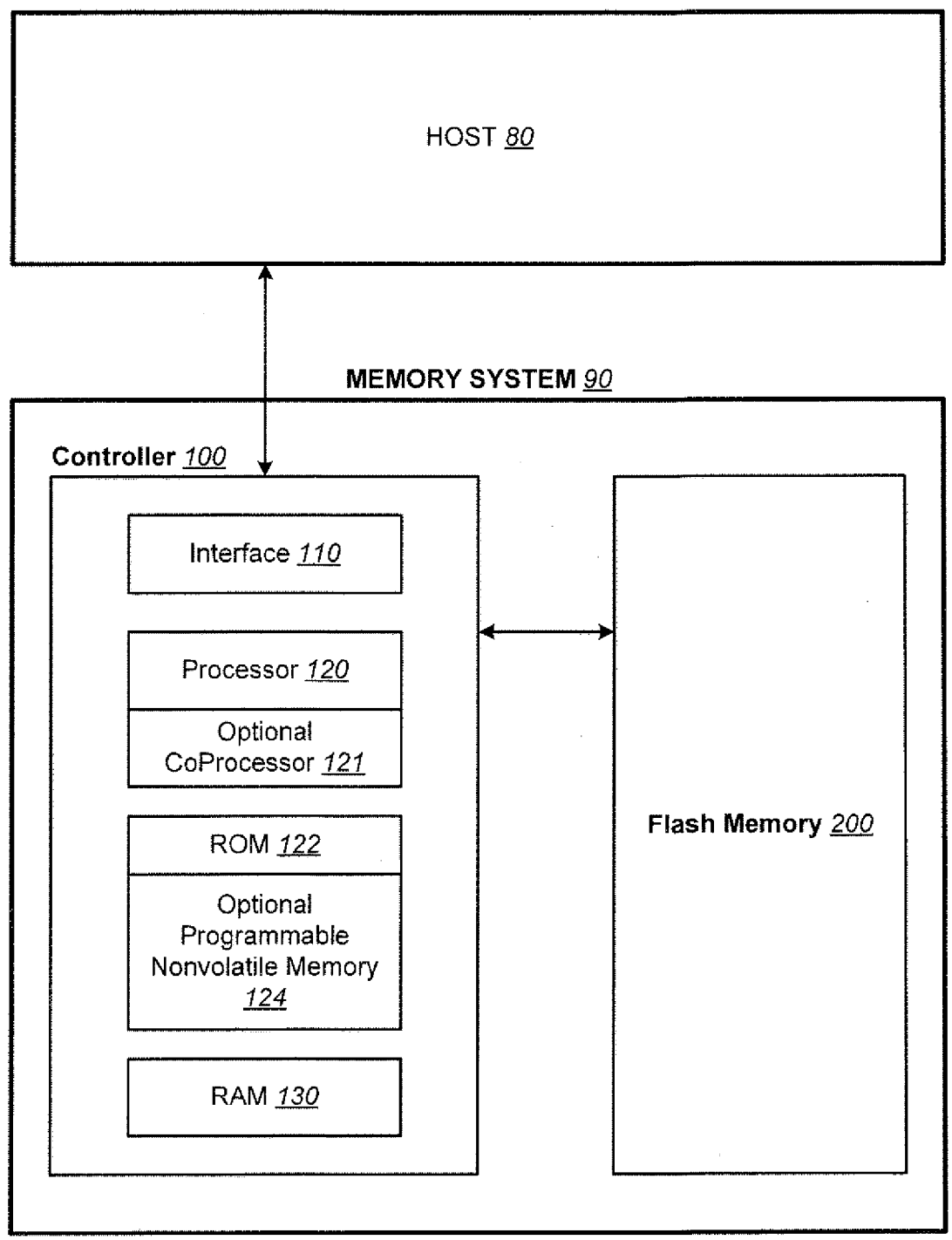
FIG. 1 illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system is typically in the form of a memory card or an embedded memory system. The memory system 90 includes a flash memory 200 whose operations are controlled by a controller 100. The memory 200 comprises one or more array of non-volatile memory cells distributed over one or more integrated circuit chips. The controller 100 includes an interface 110, a processor 120, an optional coprocessor 121, ROM 122 (read-only-memory), RAM 130 (random access memory) and optionally programmable nonvolatile memory 124. The interface 110 has one component interfacing the controller to a host and another component interfacing to the memory 200. Firmware stored in nonvolatile ROM 122 and/or the optional nonvolatile memory 124 provides codes for the processor 120 to implement the functions of the controller 100. Error correction codes may be processed by the processor 120 or the optional coprocessor 121. In an alternative embodiment, the controller 100 is implemented by a state machine (not shown.) In yet another embodiment, the controller 100 is implemented within the host.

Physical Memory Structure

Figure 2:
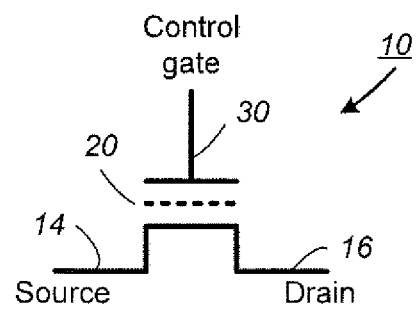
FIG. 2 illustrates an example of a charge-storage memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, for example cells may one or more charge storage element, or other data storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage elements have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
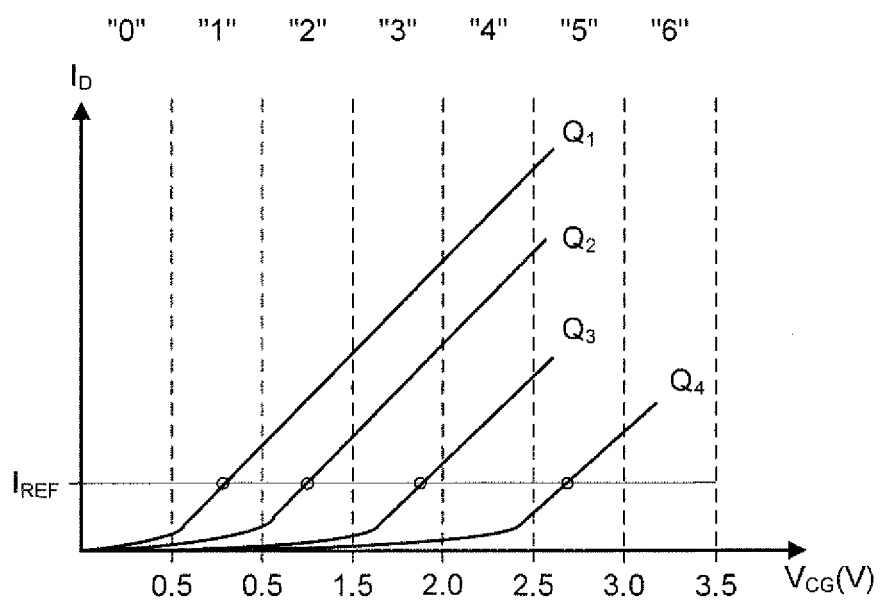
FIG. 3 illustrates operation of a charge-storage memory cell.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of the possible charge levels that can be programmed on a floating gate of a memory cell, respectively corresponding to four possible memory states. As an example, the threshold voltage window of a population of cells may range from 0.5V to 3.5V. Seven possible memory states "0", "1", "2", "3", "4", "5", "6", respectively representing one erased and six programmed states may be demarcated by partitioning the threshold window into five regions in intervals of 0.5V each. For example, if a reference current, IREF of 2 μA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold voltage window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

Figure 4A:
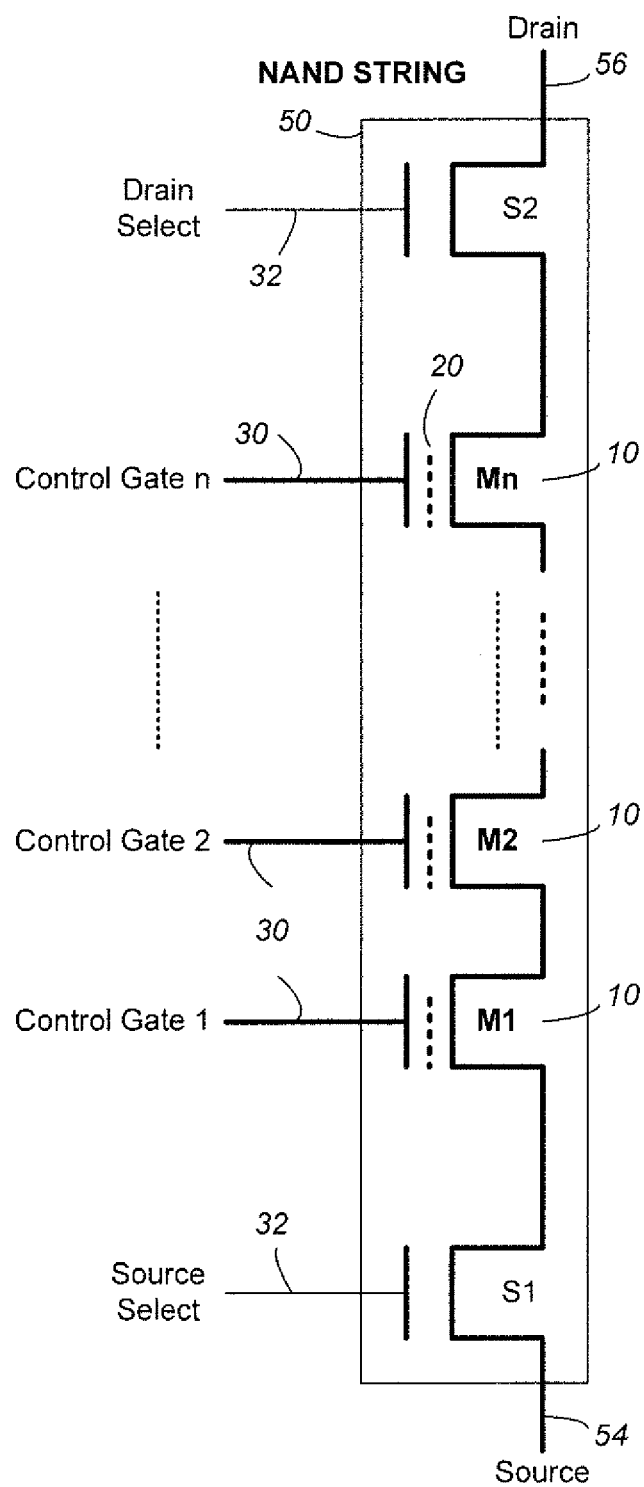
FIG. 4A illustrates a NAND string.

FIG. 4A illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
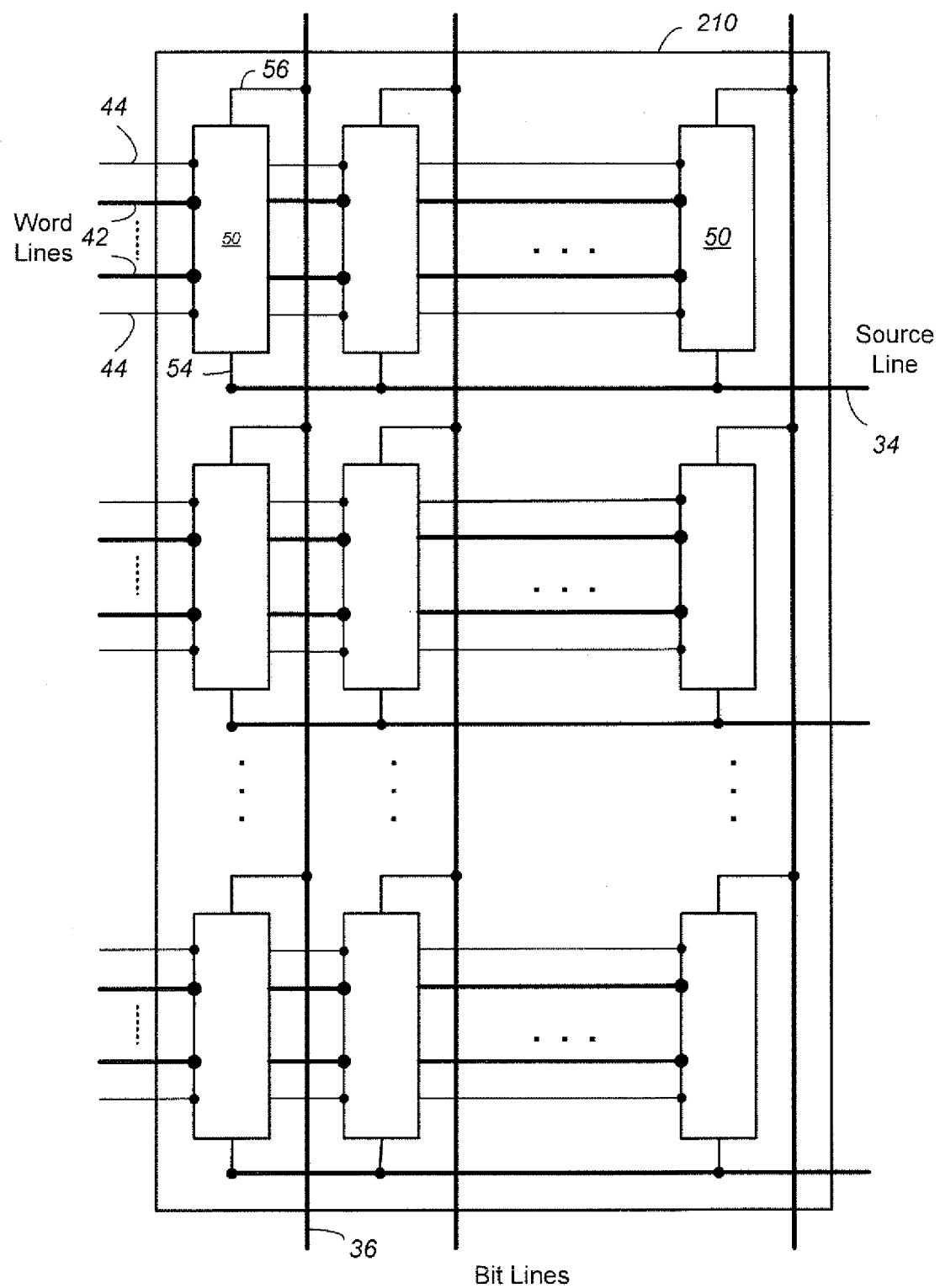
FIG. 4B illustrates a portion of a NAND array including multiple NAND strings.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
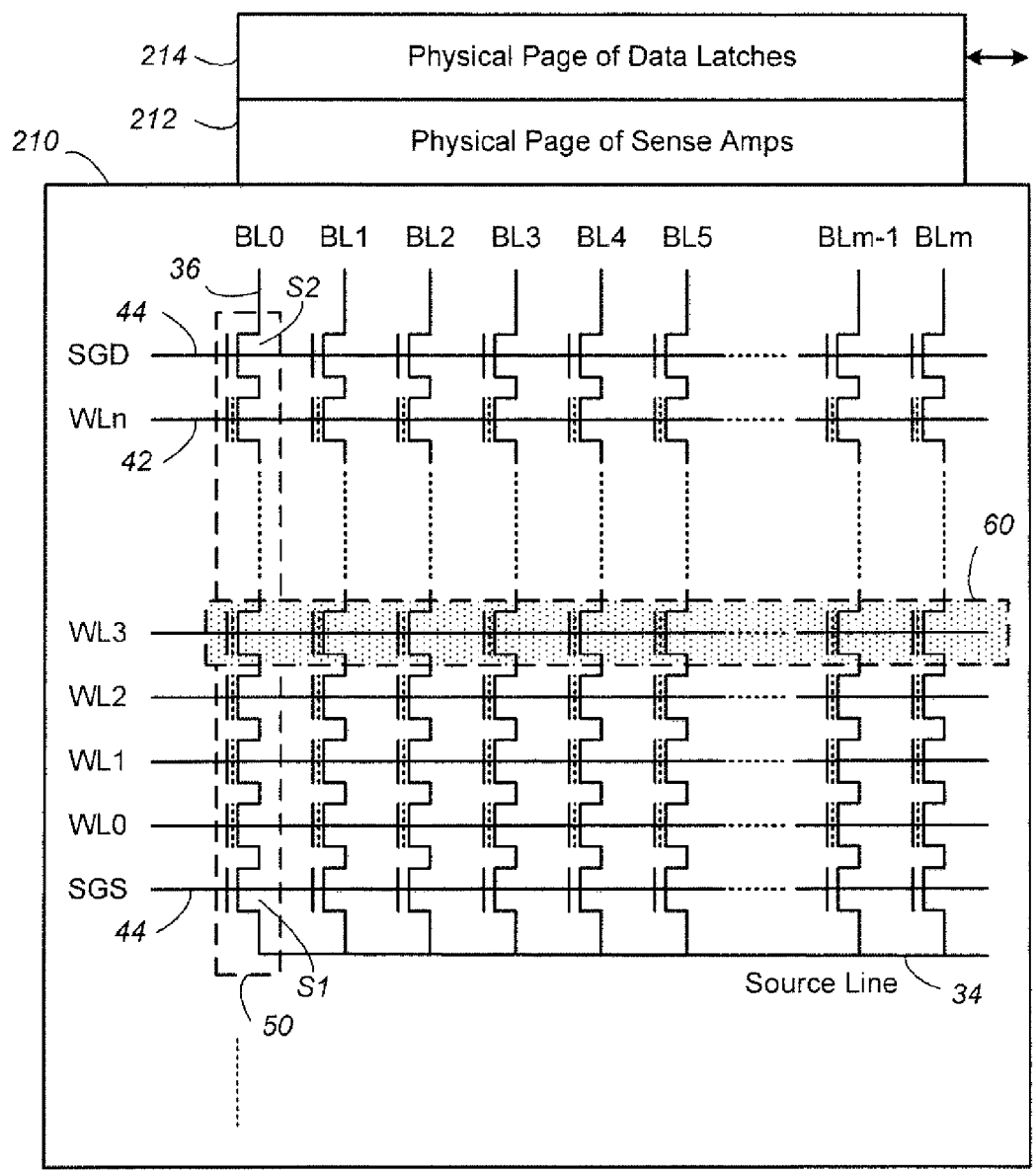
FIG. 5 illustrates operation of a portion of a NAND array.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that update data cannot overwrite existing one and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

Figure 6:
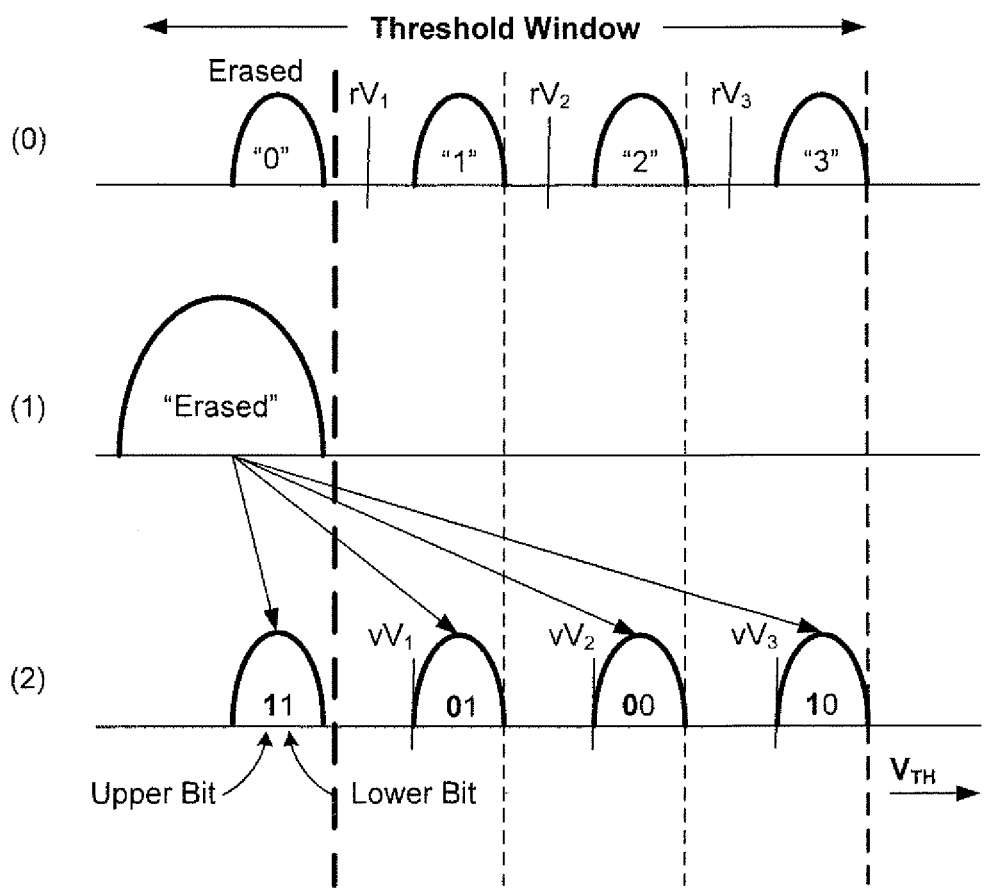
FIGS. 6(0)-6(2) illustrate programming of NAND memory in multiple states.

FIGS. 6(0)-6(2) illustrate an example of programming a population of 4-state memory cells. FIG. 6(0) illustrates the population of memory cells programmable into four distinct distributions of threshold voltages respectively representing memory states "0", "1", "2" and "3". FIG. 6(1) illustrates the initial distribution of "erased" threshold voltages for an erased memory. FIG. 6(2) illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "1", "2" and "3" or remain un-programmed in the "erased" state. As the memory gets more programming, the initial distribution of the "erased" state as shown in FIG. 6(1) will become narrower and the erased state is represented by the "0" state.

A 2-bit code having a lower bit and an upper bit can be used to represent each of the four memory states. For example, the "0", "1", "2" and "3" states are respectively represented by "11", "01", "00" and '10'. The 2-bit data may be read from the memory by sensing in "full-sequence" mode where the two bits are sensed together by sensing relative to the read demarcation threshold values $rV_1$, $rV_2$ and $rV_3$ in three sub-passes respectively.

Testing

Integrated circuits, such as nonvolatile memories, are designed to be identical across a particular production run. However, there is generally some variation from one integrated circuit to another. Some integrated circuits may be completely defective while others contain defects that affect only a portion of the integrated circuit so that the integrated circuit is still functional. Some integrated circuits may be slower than others, or consume more power, or run hotter. In general such variation is acceptable within limits. Testing is generally performed after integrated circuits are manufactured so that integrated circuits can be identified as acceptable or unacceptable based on a variety of tests. Testing may also be used to categorize, or bin, integrated circuits into different categories depending on their performance so that individual integrated circuits can be used in a manner that is appropriate to their performance (using higher performance integrated circuits for more demanding applications and lower performance integrated circuits for less demanding applications).

In nonvolatile memories, it is common to determine program time, or write time, (the time required to program, or write, a given amount of data to the memory array), read time (the time required to read a given amount of data from the memory array), and, in block-erasable memory, the erase time (the time needed to erase a block of the memory array). In many cases, each page in a nonvolatile memory is programmed and read at least once during testing to ensure that data can be reliably stored and retrieved there. The time needed to program and/or read may be determined and compared with some limit to identify bad blocks. In many cases, once the determination is made, and used to identify bad blocks, or bad portions of blocks, the test results are discarded. Similarly, the time to erase a block may be determined and used to identify bad blocks. In many cases, this erase time is discarded after bad blocks are identified.

According to an aspect of the present invention, various test results that are obtained during testing are not discarded, but instead are maintained so that they can subsequently be used in various ways. For example, various times, including program time, read time, and erase time, in a nonvolatile memory may be maintained after testing is completed. Test results may be maintained in various ways. In nonvolatile memory, a simple way to maintain the test results is to write them in the nonvolatile memory array so that they are available later. For example, a dedicated physical location may be designated for storage of such data. Test results for a particular block may be written in that block, or all test results for a particular die may be written in a predetermined block or group of blocks. Alternatively, the test results may be saved outside the nonvolatile memory system.

FIG. 7 shows an example of an operation performed during testing of an integrated circuit. A block or page of nonvolatile memory is programmed with test data 701. This may be random data, or a predetermined pattern of data. For example a test pattern may be selected to present a worst case scenario for cell-to-cell coupling when stored in the memory array. The time needed to program a page, tProg, is determined for each page of the block 703. The programming time, tProg, for each page may be used to determine whether the block is a bad block 705, for example by comparing individual page programming times with some limits, or by aggregating individual page programming times in some manner (e.g. averaging), or otherwise. When a block is identified as a bad block because programming time of at least one page exceeds some time limit, or aggregated programming time exceeds some time limit, or otherwise, the block is marked as a bad block 707. The location of the block may be recorded in a bad block map so that the block is not used. If the block is not a bad block then tProg is recorded 709 (e.g. in the nonvolatile memory array). The recorded value, tProg, may be the raw programming time for each page, or may be some aggregated value representing multiple pages (e.g. an average programming time for all pages of the block).

FIG. 8 shows another example of an operation performed during testing of an integrated circuit. Test data is read from a page in a nonvolatile memory array 811. The time required to read a page, tRead, is identified for each page that is read 813 (generally, every page of the block). The read times obtained are used to make a determination 815 as to whether the block is a bad block, for example by comparing individual page read times with some limits, or by aggregating individual page read times in some manner (e.g. averaging), or otherwise. When a block is identified as a bad block because reading time of at least one page exceeds some time limit, or aggregated read time exceeds some limit, or otherwise, the block is marked as a bad block 817. If the block is not bad then tRead is recorded 819 (e.g. in the nonvolatile memory array). The recorded value, tRead, may be the raw read time for each page, or may be some aggregated value representing multiple pages (e.g. average read time for all pages of the block). While FIG. 7 and FIG. 8 show two different operations to separately test program and read times, these operations may be combined (e.g. programming then reading the same test data and making a bad block determination based on some combined results).

Figure 9:
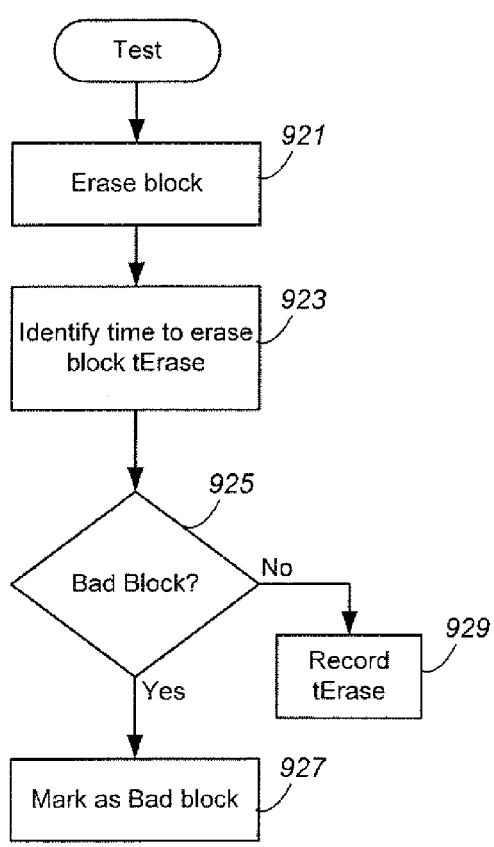
FIG. 9 illustrates an example of testing of erase time of a nonvolatile memory.

FIG. 9 shows another example of an operation performed during testing of an integrated circuit. A block of block-erasable nonvolatile memory that was previously programmed with test data is erased 921. The time required to erase the block, tErase, is identified 923 and is used to determine whether the block is a bad block 925, for example, by comparing tErase with some limit. When a block is identified as a bad block because erase time exceeds some limit, or otherwise, the block is marked as a bad block 927. If the block is not a bad block then tErase is recorded 929 (e.g. in the nonvolatile memory array).

In many cases, after integrated circuits are tested, they are subsequently used as components in larger assemblies. For example, nonvolatile memory integrated circuits are often assembled into memory systems that may include one or more nonvolatile memory integrated circuits and one or more other integrated circuits, such as a memory controller integrated circuit, or Application Specific Integrated Circuit (ASIC), mounted on a printed circuit board. Firmware may be downloaded to such memory systems so that a general purpose memory controller, or an ASIC may be customized to operate in the particular memory system. Such memory systems are often designed to operate within particular specifications, such as specifications determined by an industry standard, and firmware in conjunction with the hardware may be designed to achieve whatever performance is required by the specification.

In some cases, a memory system may operate too slowly to meet the requirements of a specification because operations in the memory array take too long, and/or because of overhead time due to data transfer, memory controller operation, and/or other factors. Overhead time is generally known for a given hardware and firmware, and operations in the memory array generally meet some minimum speed requirement if they have passed testing as described above. In some cases, a specification may require both a minimum speed a maximum speed so that some memory systems may be too fast to meet the specification. In general, testing does not reject memory dies for being too fast. However, if fast memory dies are incorporated in memory systems that have a maximum speed requirement then the memory system may exceed the maximum speed requirement and thus not satisfy the specification.

According to an aspect of the present invention, raw speed data (such as obtained during testing as described above) may be used in combination with known overhead time to determine whether a particular memory die will operate below a required maximum speed. A delay may be added in order to slow down a memory die that would otherwise exceed the speed requirement so that the memory die instead meets the speed requirement. A convenient time to determine whether a delay is appropriate, and to determine the extent of any delay, is as part of firmware download and configuration.

Figure 10:
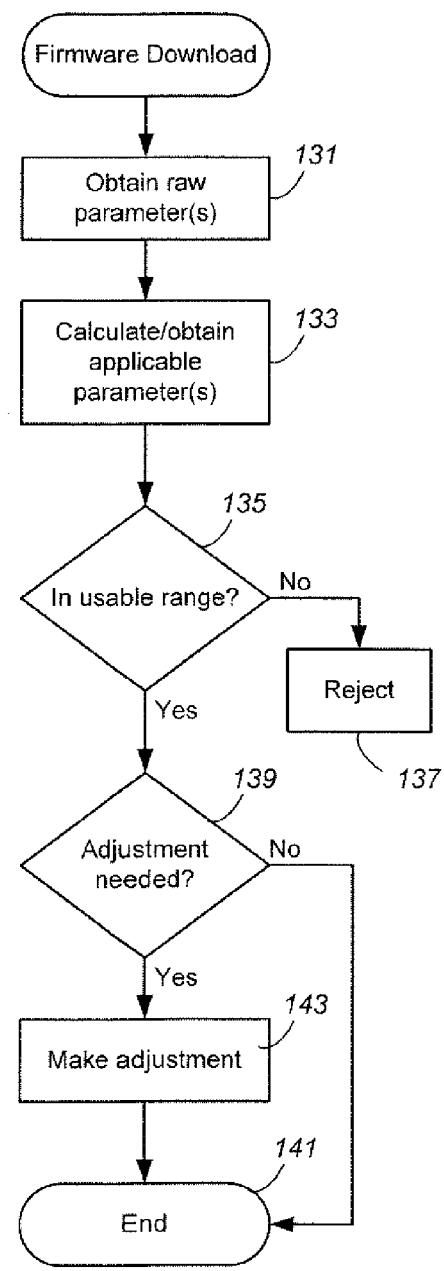
FIG. 10 illustrates an example configuration of a nonvolatile memory.

FIG. 10 illustrates certain operations that may be performed as part of firmware download. In general, the code that controls the operations shown in FIG. 10 is part of firmware so that firmware is at least partially downloaded prior to the operations shown. Raw parameters are obtained 131 (e.g. from memory or from some other source where they were previously stored). Raw parameters may include program time, read time, erase time, and any other parameters relating to integrated circuit operation. Raw parameters may be used to calculate applicable parameters 133 can be compared with values that are required by a specification (e.g. maximum speeds). For example, some calculation may be necessary to aggregate certain raw parameters to obtain applicable parameters (e.g. averaging of speeds). The applicable parameters are then compared to specified limits to determine whether the system is within a usable range 135. If it is not usable then it is rejected 137. For example, a memory system that operates below a specified minimum speed may be rejected at this point. However, a memory system that operates above a specified maximum speed may be considered usable because it can be configured to operate below the specified maximum speed. A determination is made as to whether any adjustment is necessary to bring the memory system within specified limits 139. Some memory systems may operate adequately without any adjustment in which case this process ends 141. However, some memory systems may need adjustment. In some cases, memory systems need adjustment because they operate faster than a specified maximum speed. Other memory systems may operate below the specified maximum, but still faster than desirable (e.g. close to the maximum). In order to ensure that memory systems remain within specified limits it may be desirable to bring memory systems that operate faster than a target speed to the target speed, which may be in the middle of the specified range, or somewhere close to the middle. If an adjustment is needed, the adjustment is calculated and implemented 143.

Figure 11:
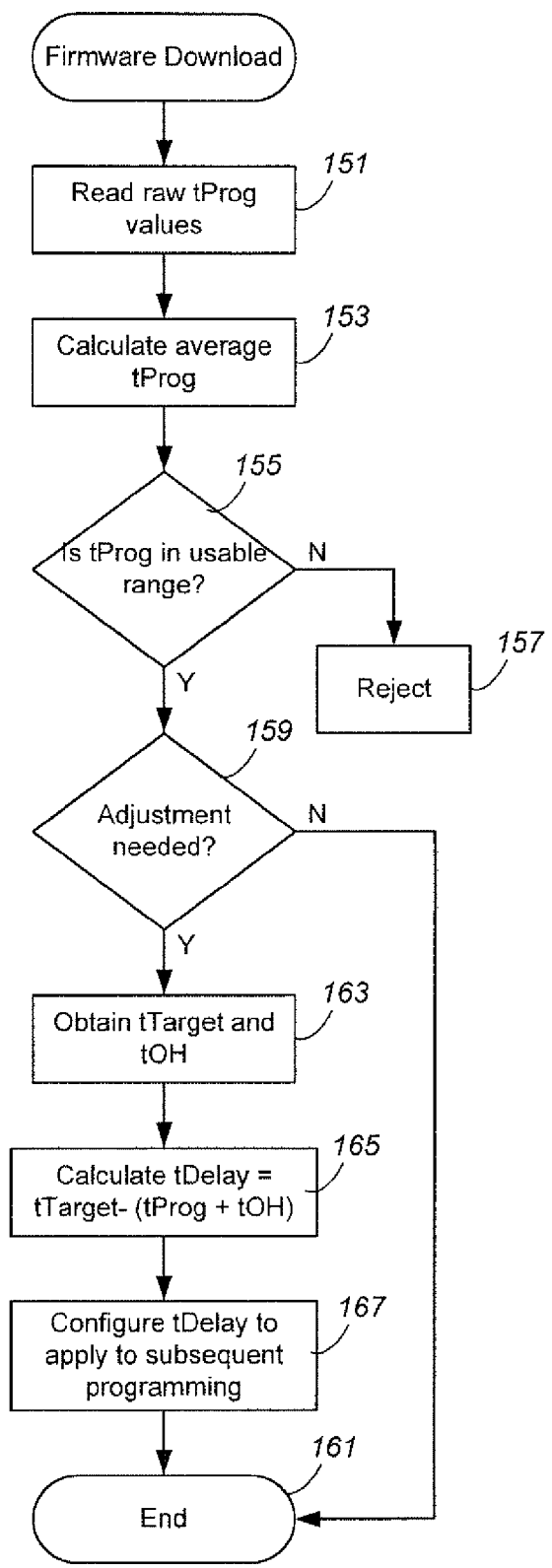
FIG. 11 illustrates an example of configuring program time of a nonvolatile memory.

FIG. 11 shows a specific implementation of the process of FIG. 10 to a programming operation in a nonvolatile memory system in which raw values are stored in a nonvolatile memory array during testing. The raw program time values are read from the nonvolatile memory array 151. These may be stored on a page-by-page basis. An average of the programming times is calculated 153 and then used to determine whether the average programming time is within a usable range 155 (e.g. whether it is within a specified range or can be brought within the specified range). If it is not within the usable range then the system is rejected 157. If it is within the usable range then a determination is made as to whether an adjustment is needed 159. If no adjustment is needed then the configuration process ends 161. If adjustment is needed then the target time, tTarget, and the overhead time, tOH, are obtained (generally they are downloaded with firmware) 163. A delay, tDelay, is then calculated 165 to bring the effective programming time to the target time, the effective programming time being the programming time, tProg, in the memory array, plus the overhead time, tOH, caused by data transfer and the memory controller, plus the delay, tDelay. So, tDelay is calculated to be: tTarget−(tProg+tOH). The value of tDelay is then stored so that it can be applied to subsequent programming 167. While this example applies to programming time, other parameters such as reading time, erase time, and others may be similarly configured as part of firmware download.

In some cases a busy signal may be asserted throughout the effective programming time even though programming has been completed (i.e. busy remains asserted during tDelay). This additional time may be used by the memory system to perform certain functions in a manner that is not visible to a host. For example, garbage collection or other housekeeping operations may be performed during this time so that the delay time is not wasted time. In this way, not only does the addition of tDelay allow a memory system to operate within a specified limit, it may allow operations to be performed in the background in an efficient manner and thus avoid having to perform such operations in the foreground, and avoid any disruption to execution of host commands.

While examples above refer to particular operations in particular systems, it will be understood that aspects of the present invention may be applied to a broad range of integrated circuits that are incorporated onto various systems. Parameters may be adjusted separately for each die, or for portions of a die, or may be adjusted for all dies in a memory system together. Multiple parameters may be adjusted by different amounts (e.g. different delays for reading, writing, and erasing). While the above examples refer to configuration as part of firmware download, subsequent reconfiguration may also be performed. For example, an initial delay may be modified after some time if the memory becomes slower so that the memory speed is returned to the middle, or near the middle, of its specified range. This modification could be performed in response to a certain write-erase count cycle, a certain time period, a host command, or some other trigger.

CONCLUSION

The foregoing detailed description has been presented for purposes of illustration and description. It is not intended to be exhaustive or to limit the invention to the precise form disclosed. Many modifications and variations are possible in light of the above teaching. The described embodiments were chosen in order to best explain the principles of the It is claimed:

1. A method of configuring a nonvolatile memory system comprising:
obtaining a raw programming time for a programming operation in at least a portion of a first nonvolatile memory array on a first memory die;
obtaining an operating overhead time for the programming operation, the operating overhead time including at least one of data transfer time for transfer of data between the first nonvolatile memory die and a memory controller die, and memory controller time associated with the programming operations;
calculating, in the nonvolatile memory system, a delay such that the raw programming time plus the operating overhead time plus the delay is within a target range for the programming operation;
applying the delay to subsequent programming operations in at least the portion of the first nonvolatile memory array to increase effective programming time to within the target range; and
wherein effective programming time in at least a portion of a second nonvolatile memory array on a second memory die is within the target range.

2. The method of claim 1 wherein the raw programming time is derived from test results that are recorded in the first nonvolatile memory array and obtained from the first nonvolatile memory array by performing a read of the first nonvolatile memory array.

3. The method of claim 1 wherein the raw programming time is an average of a plurality of programming times obtained during testing.

4. The method of claim 1 wherein the delay is obtained for the first nonvolatile memory die, and further comprising obtaining additional delays for additional nonvolatile memory dies, each additional delay being individually calculated from a raw programming time of a corresponding additional memory die.

5. The method of claim 4 wherein overhead time is substantially the same for all portions of the first nonvolatile memory die and the additional memory dies.

6. The method of claim 5 wherein the overhead time is determined for a particular firmware version operating with a particular nonvolatile memory design, the overhead time being downloaded when the particular firmware version is downloaded to a nonvolatile memory having the particular nonvolatile memory design.

7. The method of claim 6 wherein the target time is downloaded to the nonvolatile memory system with firmware.

8. A nonvolatile memory system comprising:
a first nonvolatile memory array on a first nonvolatile memory die;
a second nonvolatile memory array on a second nonvolatile memory die;
a memory controller on a memory controller die connected to the first nonvolatile memory die and the second nonvolatile memory die, the memory controller configured to determine a first program delay time, for program operations in the first nonvolatile memory array from a first raw programming time, and a first overhead time that includes at least one of data transfer time for transfer of data between the first nonvolatile memory die and the memory controller die, and memory controller time associated with the program operations, and to apply the program delay to subsequent programming operations to increase an effective programming time to within a target range; and
wherein the second nonvolatile memory array on the second nonvolatile memory die has an effective programming time that is within the target range.

9. The nonvolatile memory system of claim 8 wherein the memory controller is further configured to calculate the first raw programming time from an average of a plurality of measured programming times.

10. The nonvolatile memory system of claim 8, wherein the memory controller is further configured to write the first program delay time to the first nonvolatile memory array for subsequent use.

11. The nonvolatile memory system of claim 8 wherein the memory controller is configured to operate according to firmware and wherein the first overhead time and the target range are downloaded with the firmware.

12. The nonvolatile memory system of claim 11 wherein the memory controller is configured to calculate the first program delay time at a time following downloading of the firmware.

13. The nonvolatile memory system of claim 8 wherein the first raw programming time is obtained from testing of programming time in the first nonvolatile memory array.

14. The nonvolatile memory system of claim 8 wherein the first nonvolatile memory array is a NAND flash memory array.

15. An integrated circuit configured to calculate a program delay time for program operations in a first nonvolatile memory die from a raw programming time that is obtained from testing of the first nonvolatile memory die, and an overhead time that includes at least one of data transfer time for transfer of data between the first nonvolatile memory die and the integrated circuit, and memory controller time associated with the program operations, and to apply the program delay to subsequent programming operations in the first nonvolatile memory die to increase an effective programming time of the first nonvolatile memory die to be within a target programming range; and;
wherein the integrated circuit is configured to apply no program delay to a second nonvolatile memory die that has an effective programming time within the target programming range.

16. The integrated circuit of claim 15 wherein the integrated circuit is configured to operate according to firmware and wherein the overhead time and the target programming range are downloaded with the firmware.

17. The integrated circuit of claim 16 wherein the integrated circuit is configured to calculate the program delay time at a time following downloading of the firmware.

18. The integrated circuit of claim 15 wherein the raw programming time is obtained from testing of the first nonvolatile memory die prior to assembly with the integrated circuit.

* * * * *